United States Patent
Ashokkumar et al.

(10) Patent No.: US 9,514,816 B1
(45) Date of Patent: Dec. 6, 2016

(54) NON-VOLATILE STATIC RAM AND METHOD OF OPERATION THEREOF

(71) Applicant: Cypress Semiconductor Corporation, San Jose, CA (US)

(72) Inventors: Jayant Ashokkumar, Colorado Springs, CO (US); Donald J. Verhaeghe, Colorado Springs, CO (US); Alan D DeVilbiss, Colorado Springs, CO (US); Qidao Li, Colorado Springs, CO (US); Fan Chu, Colorado Springs, CO (US); Judith Allen, Monument, CO (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/864,594

(22) Filed: Sep. 24, 2015

Related U.S. Application Data

(60) Provisional application No. 62/175,684, filed on Jun. 15, 2015.

(51) Int. Cl.
| | | |
|---|---|---|
| *G11C 11/00* | (2006.01) | |
| *G11C 14/00* | (2006.01) | |
| *G11C 11/22* | (2006.01) | |
| *G11C 11/419* | (2006.01) | |

(52) U.S. Cl.
CPC ......... *G11C 14/0072* (2013.01); *G11C 11/221* (2013.01); *G11C 11/2273* (2013.01); *G11C 11/419* (2013.01)

(58) Field of Classification Search
CPC ................................. G11C 14/0072
USPC ....................... 365/145, 154, 156
See application file for complete search history.

(56) References Cited

U.S. PATENT DOCUMENTS

| | | | |
|---|---|---|---|
| 6,363,011 B1 | 3/2002 | Hirose et al. | |
| 6,992,928 B2 | 1/2006 | Inoue | |
| 6,996,000 B2 | 2/2006 | Chen et al. | |
| 7,206,217 B2 * | 4/2007 | Ohtsuka | G11C 14/0072 365/154 |
| 7,734,943 B2 | 6/2010 | Whelan et al. | |
| 7,859,899 B1 | 12/2010 | Shakeri et al. | |
| 8,018,768 B2 | 9/2011 | Shih et al. | |
| 8,381,075 B2 | 2/2013 | Toops et al. | |
| 8,472,236 B2 | 6/2013 | Summerfelt et al. | |
| 8,508,983 B2 * | 8/2013 | Wang | G11C 14/0054 365/154 |
| 9,001,583 B2 | 4/2015 | Lee et al. | |
| 9,058,288 B2 | 6/2015 | Golov et al. | |
| 2002/0034092 A1 | 3/2002 | Choi et al. | |
| 2002/0145907 A1 | 10/2002 | Byeon et al. | |

(Continued)

FOREIGN PATENT DOCUMENTS

JP 2001167584 A * 6/2001

OTHER PUBLICATIONS

"F-RAM Technology Brief", Ramtron Corporation, dated Sep. 2007; 4 pages.

(Continued)

*Primary Examiner* — Son Mai

(57) ABSTRACT

A memory device and array which includes a static random access memory (SRAM) circuit coupled to a non-volatile circuit, such as a ferroelectric-RAM (F-RAM) circuit, in which the F-RAM circuit stores a bit of data from the SRAM circuit during power-out periods, the F-RAM circuit is further coupled to bit-line(s) to output the bit of data stored in the F-RAM circuit when operation power is restored.

20 Claims, 10 Drawing Sheets

(56) References Cited

U.S. PATENT DOCUMENTS

| | | |
|---|---|---|
| 2003/0043656 A1 | 3/2003 | Abedifard et al. |
| 2003/0128569 A1 | 7/2003 | Chen et al. |
| 2008/0151624 A1 | 6/2008 | Still |
| 2010/0128516 A1 | 5/2010 | Cho et al. |
| 2013/0003462 A1 | 1/2013 | Castagna et al. |
| 2013/0247057 A1* | 9/2013 | Fujimori ............ G11C 14/0072 718/102 |

OTHER PUBLICATIONS

Babu, et al., "Non-Volatile Static Random Access Memory (NVSRAM)—High Speed Nonvolatility", Cypress Semiconductor Corporation, dated Jun. 2007; 7 pages.

International Search Report for International Application No. PCT/US2016/016196 dated Jun. 10, 2016; 4 pages.

Written Opinion of the International Searching Authority for International Application No. PCT/US2016/016196 dated Jun. 10, 2016; 14 pages.

\* cited by examiner

NON-VOLATILE STATIC RAM AND METHOD OF OPERATION THEREOF

PRIORITY

The present application claims the priority and benefit under 35 U.S.C. §119(e) of U.S. Provisional Application No. 62/175,684, filed on Jun. 15, 2015, which is incorporated by reference herein in its entirety.

TECHNICAL FIELD

The present disclosure relates generally to a non-volatile (NV) memory device, and more particularly, to a ferroelectric random access memory (F-RAM) device incorporating a static random access memory (SRAM) device to eliminate the need to restore the F-RAM after a destructive read operation.

BACKGROUND

Memory that retains its data even when operation power is not available is classified as nonvolatile memory. Examples of non-volatile memory are nvSRAM, F-RAM, electrically erasable programmable read-only memory (EEPROM), and flash memories. This class of memory may be used in applications in which critical data must be stored after power is removed, or when power is interrupted during operation. An example of power interruptions is the hot plugging of cards in servers, industrial computers, and medical equipment. Several submodules can be unplugged while the equipment is operating (that is, their power can be interrupted) and new submodules can be plugged in (hot plugged because power is present in the equipment) without losing any critical data and/or operations to the equipment.

Conventional static random access memory (SRAM) loses its content when powered down, and is classified as volatile memory. The memory is volatile because there is no data when power is restored to the device. Another example of volatile memory is dynamic random access memory (DRAM) which is sometimes used in desktop computers and laptops.

The non-volatile SRAM (nvSRAM) is a class of NV memory that combines SRAM interface and speed with the non-volatility of a NV memory cell. The nvSRAM may achieve high speed and non-volatile storage at low cost compared to alternative solutions, such as large supercapacitors and batteries to retain data on devices when power is interrupted. These applications include but are not limited to smart meters, servers, industrial programmable logic controllers (PLCs), gaming, multifunction printers, and storage units.

In general, if there is a possibility of power to the nvSRAM being lost, the bit of data can be transferred from the SRAM portion of the cell to the NV portion for storage. At a later time, the bit of data can be returned from the NV portion back to the SRAM portion in a recall operation. SRAM may then transmit the bit of data to the exterior environment, if desired.

BRIEF DESCRIPTION OF THE DRAWINGS

The present disclosure is illustrated by way of example, and not by way of limitation, in the FIGS. of the accompanying drawings.

DETAILED DESCRIPTION

Figure 1A:
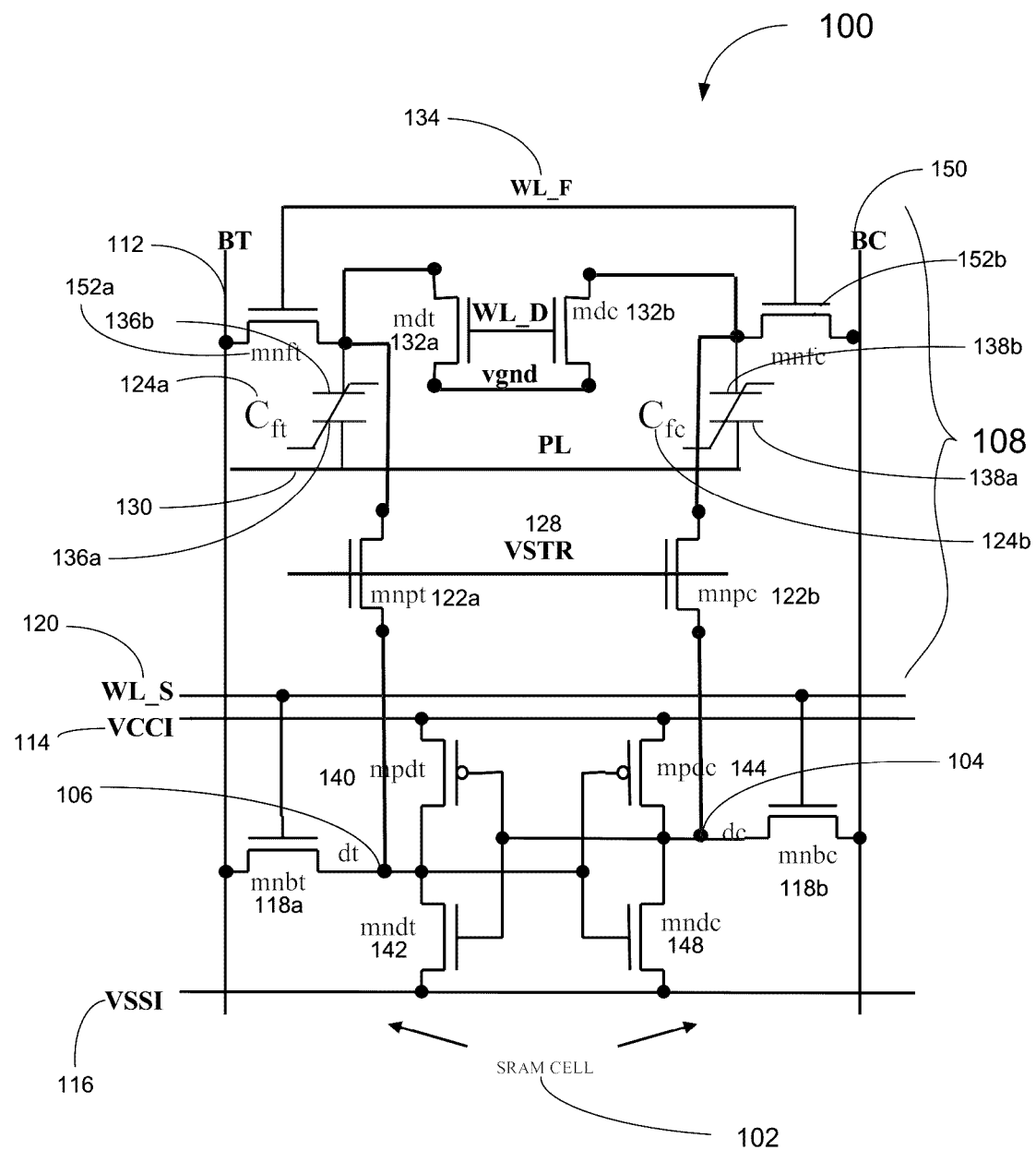
FIG. 1A is a schematic diagram illustrating an nvSRAM memory cell in accordance with one embodiment of the subject matter.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

It is a common practice for computers and other processing devices to store information or programs which have been developed or updated in NV memory, such as flash memory, EEPROM, F-RAM, so that in the event of a power outage or a mistake, data can be retrieved. However, in many applications, high speed data access and processing is desired and information stored in memory may be randomly accessible. SRAM allows high speed random access to its content and does not require constant refreshing like dynamic RAM (DRAM) cells which typically consume more power. SRAM is however volatile and when power is removed or dips below a threshold value for a period of time, the data eventually dissipates. An nvSRAM, in general, is a memory device constructed by combining an NV memory cell with an SRAM cell, and may look like SRAM externally. However, an nvSRAM is capable of doing more than an SRAM. While an SRAM can be read from, written to and maintain/retain its data when operation power is available, an nvSRAM is non-volatile which retains data even when power is unavailable.

Embodiments of a ferroelectric capacitor based nvSRAM cell (F-SRAM), and methods of operating the same, which allow speedy access to data when operating power is available and eliminate the need of external capacitors (VCAP) or charge pumps during power down, will now be described with reference to the accompanying drawings. The drawings described are only schematic and are non-limiting. In the drawings, the size of some of the elements may be exaggerated and not drawn to scale for illustrative purposes. The dimensions and the relative dimensions may not correspond to actual reductions to practice of the subject matter. For purposes of clarity, many details of input devices and methods of operation in general, and in particular, which are widely known and not relevant to the present apparatus and method have been omitted from the following description.

FIG. 1A is a schematic diagram illustrating nvSRAM cell 100 in accordance with one embodiment of the subject matter. In one embodiment, nvSRAM cell 100 includes nv circuit or cell 108 and SRAM circuit or cell 102. SRAM cell 102 includes a volatile memory circuit whereas nv cell 108 is circuitry including NV element, such as ferroelectric devices coupled to the SRAM cell 102. In one embodiment, nvSRAM cell 100 has a plurality of n-channel, field-effect transistors (FET), a plurality of nonvolatile elements, such as nonvolatile capacitors, and may be a plurality of resistors. It should, however, be appreciated that other types of transistors, such as p-channel FETs, and combinations of different types of transistors, capacitors, resistors may be utilized. It will be seen that SRAM cell 102 includes a complementary metal-oxide-silicon (CMOS) SRAM cell, but it is emphasized herein that such a memory cell is illustrative only and that other types of SRAM memory cells may be alternatively or additionally included. While the nvSRAM cell 100 illustrated in FIG. 1A may include a single nvSRAM cell 100 (in this case, a single SRAM cell 102 and a single nv cell 108), it should be appreciated that an nvSRAM device typically includes a plurality of nvSRAM cells 100 that are integrated with a controller or other processing elements onto a single semiconductor chip to form an array. In one embodiment, an nvSRAM array may contain more than one million nvSRAM cells 100. The motivation for creating integrated semiconductor chips with ever larger arrays of nvSRAM cells 100 is that the area per cell decreases as more cells are integrated onto a single chip.

In one embodiment, SRAM cell or circuit 102 is capable of communicating one bit of data with an exterior environment and nv cell or circuit 108 provides backup storage to SRAM cell 102 in the event power is removed from nvSRAM cell 100. More particularly, SRAM cell 102 is capable, as long as power is being provided, of receiving a bit of data (true bit and complementary bit) from an exterior environment, retaining/maintaining the bit of data, and transmitting the bit of data back to the exterior environment via bit-lines BT 112 and BC 150. In one embodiment, the six transistors (6T) configuration of SRAM cell 102 is capable of running at high speeds. However, if power is removed from SRAM cell 102, the bit of data will be lost. In one embodiment, nv cell 108 of nvSRAM cell 100 prevents loss of the bit of data by providing the capability to receive the bit of data from SRAM cell 102, store the bit of data in the absence or reduction of power being provided to SRAM cell 102, output the bit of data to the exterior environment when interrogated, and may return the bit of data to SRAM cell 102 when power is restored to operational level. As a result, nvSRAM 100 may provide the high running speed of SRAM cell 102 when power is available but is capable of storing the bit of data to nv cell 108 when power is down.

In the illustrated example in FIGS. 1-6, the volatile SRAM cell 102 may include six transistors (6T configuration). The word static indicates that the memory retains its contents as long as power VCCI 114 remains applied. Random access means that locations in the memory can be written to or read from in any order, regardless of the memory location that was accessed last. Each bit of data in an SRAM cell 102 is stored on four transistors that form two cross-coupled inverters. In one embodiment, SRAM cell 102 has two stable states, which are used to denote 0 and 1 (complementary data pair). Two additional transistors serve to control access to SRAM cell 102 during read and write operations. Accordingly, six transistors store one bit of data (one true bit and one complementary bit). In one embodiment, as illustrated in FIG. 1, transistors mpdt 140 and mndt 142 form a first inverter and transistors mndc 148 and mpdc 144 form a second inverter. The output of the first inverter at dt 106 (data true node) is coupled to the input of the second inverter and the output of the second inverter at dc 104 (data complementary node) is coupled to the input of the first inverter. In one embodiment, the configuration of the first and second inverters forms the latch in SRAM cell 102. There are two pass transistors mnbt 118a and mnbc 118b that are coupled and driven by the word-line signal WL_S 120. The first pass transistor mnbt 118a connects bit-line BT 112 to the data true node dt 106 and the second pass transistor mnbc 118b connects the bit-line complement BC 150 to the data complement node dc 104. As illustrated in FIG. 1, one end of transistors mndt 142 and mndc 148 are coupled to VSSI 116, which may normally be set to 0V. One end of transistors mpdt 140 and mpdc 144 are coupled to signal VCCI 114, which is normally at a full VCC (supply voltage) level to provide operating power to SRAM cell 102. In one embodiment, latch nodes dt 106 and dc 104 of SRAM cell 102 are coupled respectively by the source-drain paths of a further pair of store transistors mnpt 122a and mnpc 122b.

In one embodiment, SRAM cell 102 typically has three states: standby, writing and reading. In the standby state, SRAM cell 102 is idle and waiting for a read or a write operation to occur. In the stand-by mode operation, the word-line WL_S 120 is not asserted so transistors mnbt 118a and mnbc 118b disconnect SRAM cell 102 from bit-lines BT 112 and BC 150, respectively. The first cross coupled inverter formed by transistors mpdt 140 and mndt 142 and the second cross coupled inverter formed by transistors mpdc 144 and mndc 148 continue to reinforce each other and the complementary data pair remains unchanged and maintained. In the write state, the contents of SRAM cell 102, in particular latch nodes dt 106 and dc 104 are updated. The write cycle begins by asserting the value to be written to the bit-lines BT 112 and BC 150. In one exemplary embodiment, dt 106 is at a logic level 1 and dc 104 is at a logic level 0 before the write operation. If a logic 0 is desired to be written to dt 106, then bit-line BT 112 is taken to ground while BC 150 is pre-charged to a full VCC level. Upon asserting word-line WL_S 120, high node dt 106 inside SRAM cell 102 gets discharged through transistor mnbt 118a to ground and SRAM cell 102 flips its state, thus writing a logic 0 into the cell, and more particularly to dt 106. In the read state, data within SRAM cell 102 is requested and interrogated. Assume for purposes of explanation that the contents of the memory of SRAM cell 102 is a logic 1 stored at dt 106 and a logic 0 stored at dc 104. The read cycles starts by pre-charging both the bit-lines BT 112 and BC 150 to logic 1, then asserting the word-line WL_S 120, thereby enabling both transistors mnbt 118a and mnbc 118b. The values stored in dt 106 and dc 104 are transferred to the bit-lines BT 112 and BC 150 by leaving BT 112 at its pre-charged value (logic 1) and discharging BC 150 through transistor mnbc 118b and transistor mndc 148 to ground at VSSI 116. On the BT 112 side, transistor mnbt 118*a* is cutoff because the gate to source voltage $V_{GS}$ on transistor mnbt 118*a* equals to 0V, and thus BT 112 remains pre-charged at logic 1. If, however, the content of the memory of SRAM cell 102 is logic 0 (at dt 106), the opposite operation would happen and BC 150 would be pulled towards logic 1 and BT 112 would discharge through transistor mnbt 118*a* and transistor mndt 142. In one embodiment, two bit-lines i.e. BT 112 and BC 150 are not required, however, together the true data signal at dt 106 and the complementary data signal at dc 104 provide improved noise margins during sensing.

In general, the non-volatile portion of an nvSRAM may be transistor based, such as floating gate transistors and silicon-oxide-nitride-oxide-silicon (SONOS) transistors, capacitor based, such as F-RAM, others such as magnetoresistive (MRAM), resistive (RRAM) and a combination thereof. In one embodiment, a store operation of an nvS-RAM stores data that is in volatile SRAM to NV memory cell in different ways, such as autostore, hardware store, and software store. In one embodiment, autostore happens automatically when the main power source drops below a threshold level, e.g. SRAM cell operation voltage. When this occurs, in the case of transistor based NV cell, such as SONOS, the power control is switched from main power source to capacitor(s). The capacitor, which may be external, will power the nvSRAM long enough to store the SRAM contents (one bit of data) into the non-volatile part. In one embodiment, an external capacitor or charge pumps may be necessary because SONOS and floating gate transistors require relatively high program/erase voltages (up to +/−10V) and internal core supply from the SRAM cell, which is in the range of 1.8V+/−200 mV, may not be enough for the autostore or NV store operation.

In one embodiment, nvSRAM cell 100 of the subject matter is a capacitor based nvSRAM, and more particularly a ferroelectric capacitor based nvSRAM or F-SRAM. In other embodiments, nvSRAM cell 100 is a differential or a single ended cell which may include other NV elements as discussed above. As illustrated in FIG. 1, nv cell 108 includes a first ferroelectric capacitor Cft 124*a* and a second ferroelectric capacitor Cfc 124*b* for storing respectively the true logic state and the complementary logic state of SRAM cell 102, maintained at dt 106 and dc 104 respectively. In one embodiment, Cft 124*a* and Cfc 124*b* may have a similar if not identical structure, and each further includes a lower plate (electrodes) 136*a* & 138*a* and an upper plate (electrodes) 136*b* & 138*b*, respectively. Lower plates 136*a* & 138*a* of the ferroelectric capacitors 124*a* & 124*b* are coupled to polarization line/signal PL 130 whereas upper plates 136*b* & 138*b* are each coupled to the source-drain path of pass transistors mnft 152*a* & mnfc 152*b*, respectively. Pass transistors mnft 152*a* & mnfc 152*b* are both coupled and driven by word-line/signal WL_F 134 and coupled to bit-lines BT 112 and BC 150, respectively. In one embodiment, upper plates 136*b* & 138*b* are further each coupled to the true data node dt 106 and complementary data node dc 104 of SRAM cell 102 via store transistors mnpt 122*a* and mnpc 122*b*, respectively. Store transistors mnpt 122*a* and mnpc 122*b* are coupled to and driven by store line or signal VSTR 128, which effectively controls connection between nv cell 108 and SRAM cell 102 of NVSRAM 100. In one embodiment, store signal VSTR 128 is configured to only allow data transmission from SRAM cell 102 to nv cell 108. The unidirectional data transmission within the NVSRAM 100 is maintained throughout all operations of nvSRAM 100.

Figure 2:
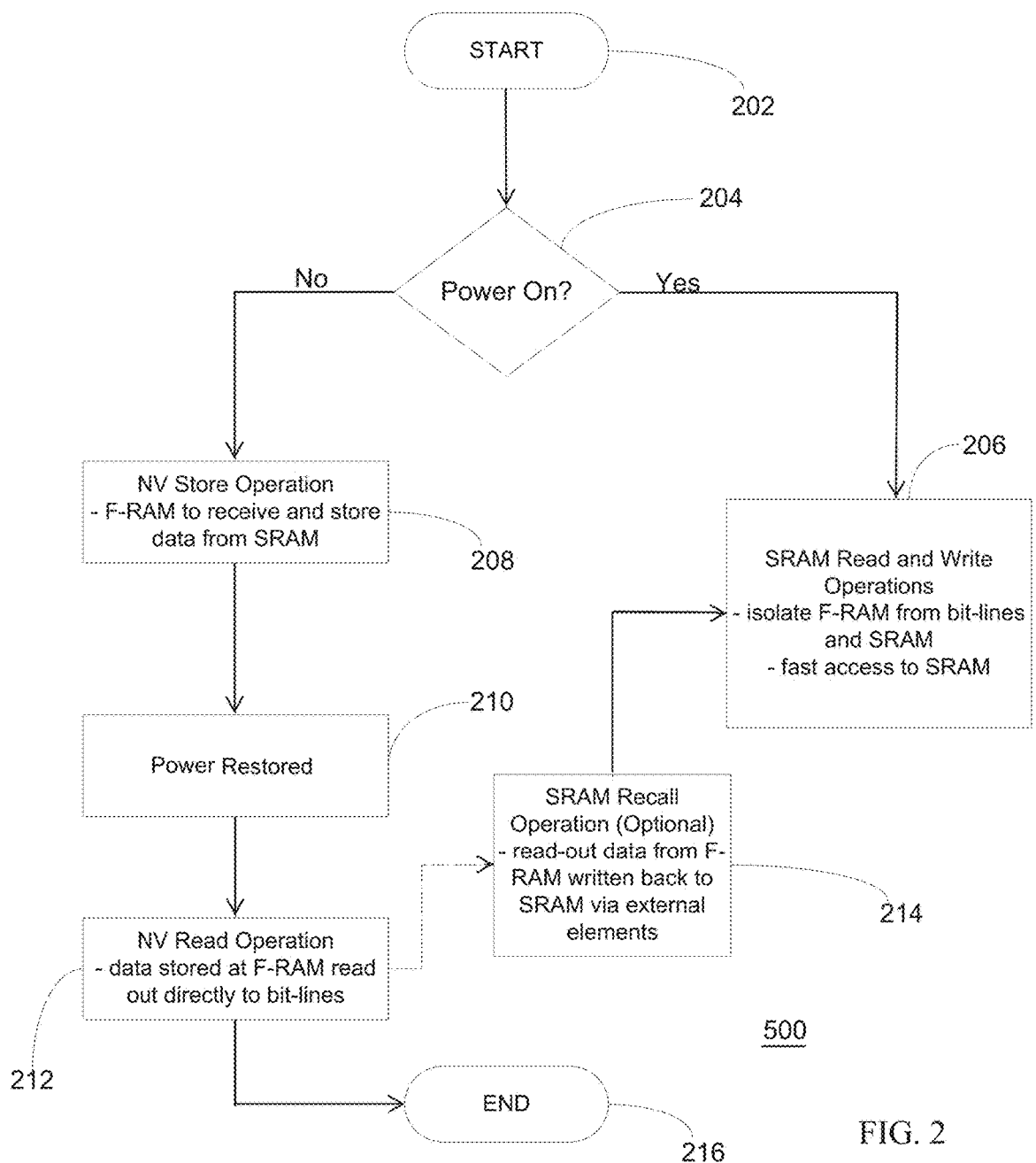
FIG. 2 is a flow diagram illustrating a summary of operations of an nvSRAM memory cell in accordance with one embodiment of the subject matter.
Figure 3:
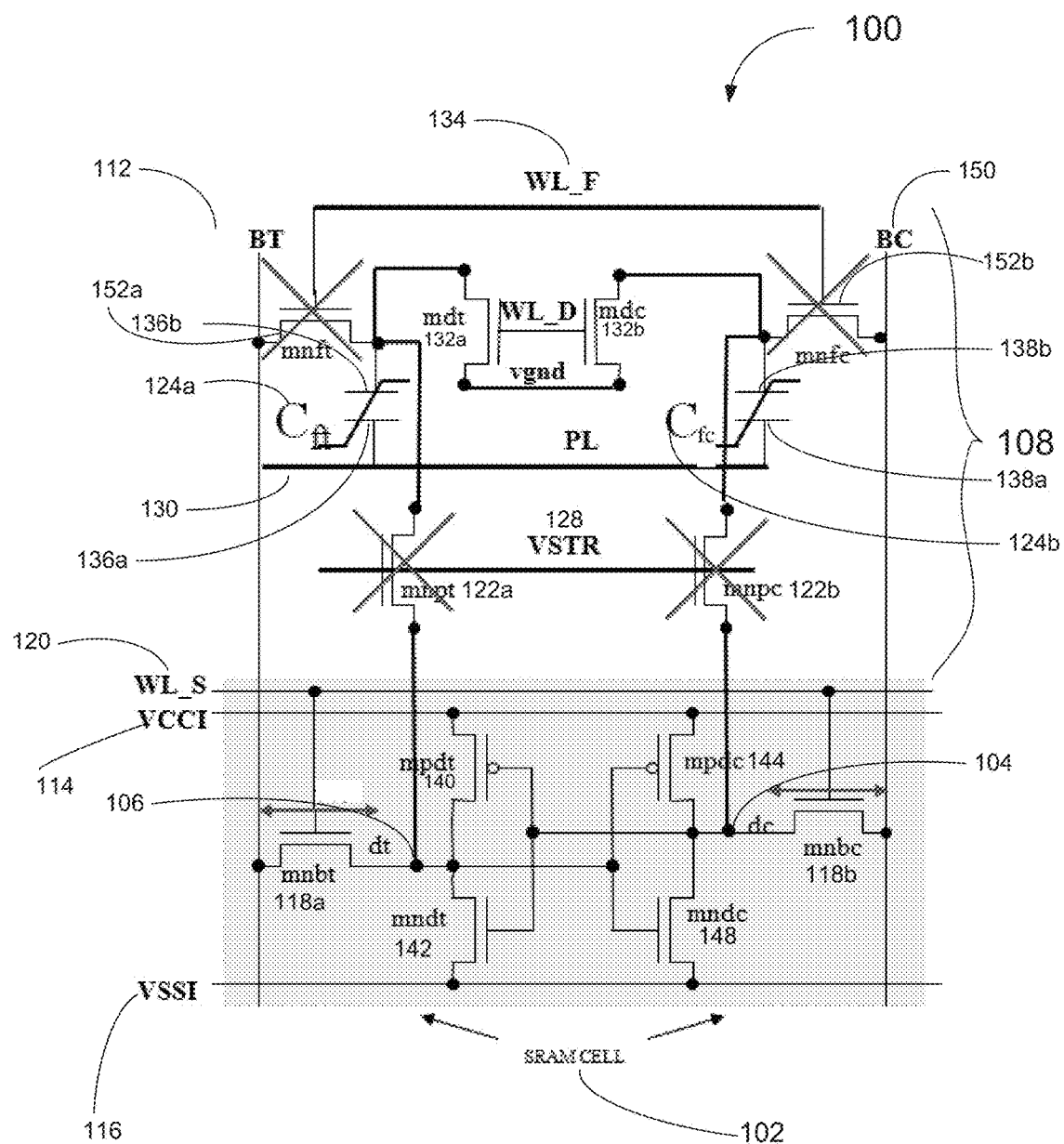
FIG. 3 is a schematic diagram illustrating an nvSRAM memory cell in accordance with one embodiment of the subject matter during an SRAM read operation.
Figure 4:
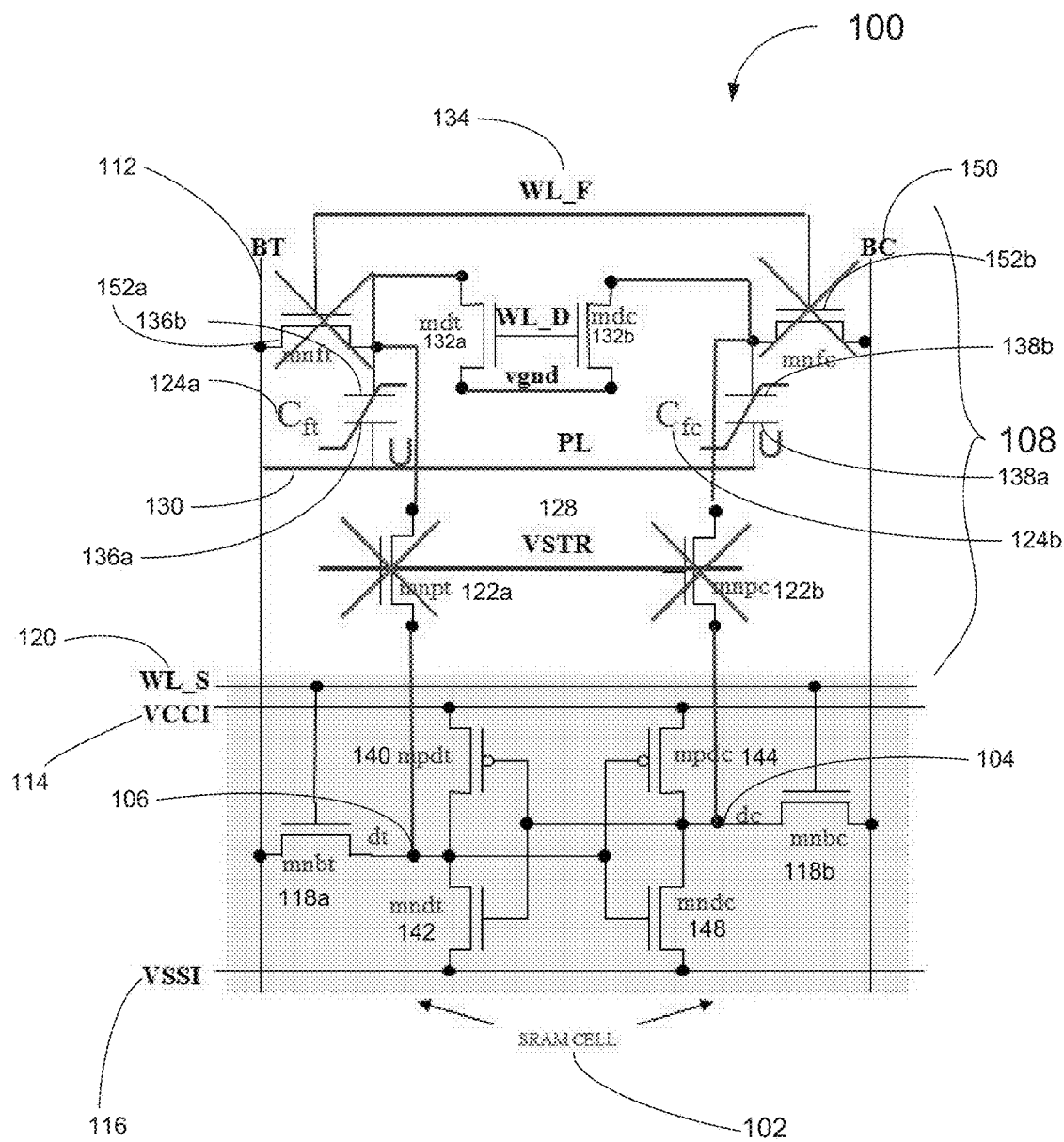
FIG. 4 is a schematic diagram illustrating an nvSRAM memory cell in accordance with one embodiment of the subject matter during an SRAM write operation.

SRAM Operation, Power-on Configuration:

Referring to step 206 of FIG. 2, in one embodiment, when power supply VCCI 114 is at or above operating power of SRAM cell 102, NVSRAM 100 operates like a conventional SRAM, which may run at high speed. To achieve this configuration, as illustrated in FIGS. 3 and 4, during a read operation, a write operation and a stand-by state of SRAM cell 102, signal WL_F 134 and VSTR 128 are not asserted, thus turning off the two pass transistors mnft 152*a* and mnfc 152*b* and the two store transistors mnpt 122*a* and mnpc 122*b*, purposely isolating nv cell 108 from bit-lines BT 112 and BC 150, and SRAM cell 102.

Figure 1B:
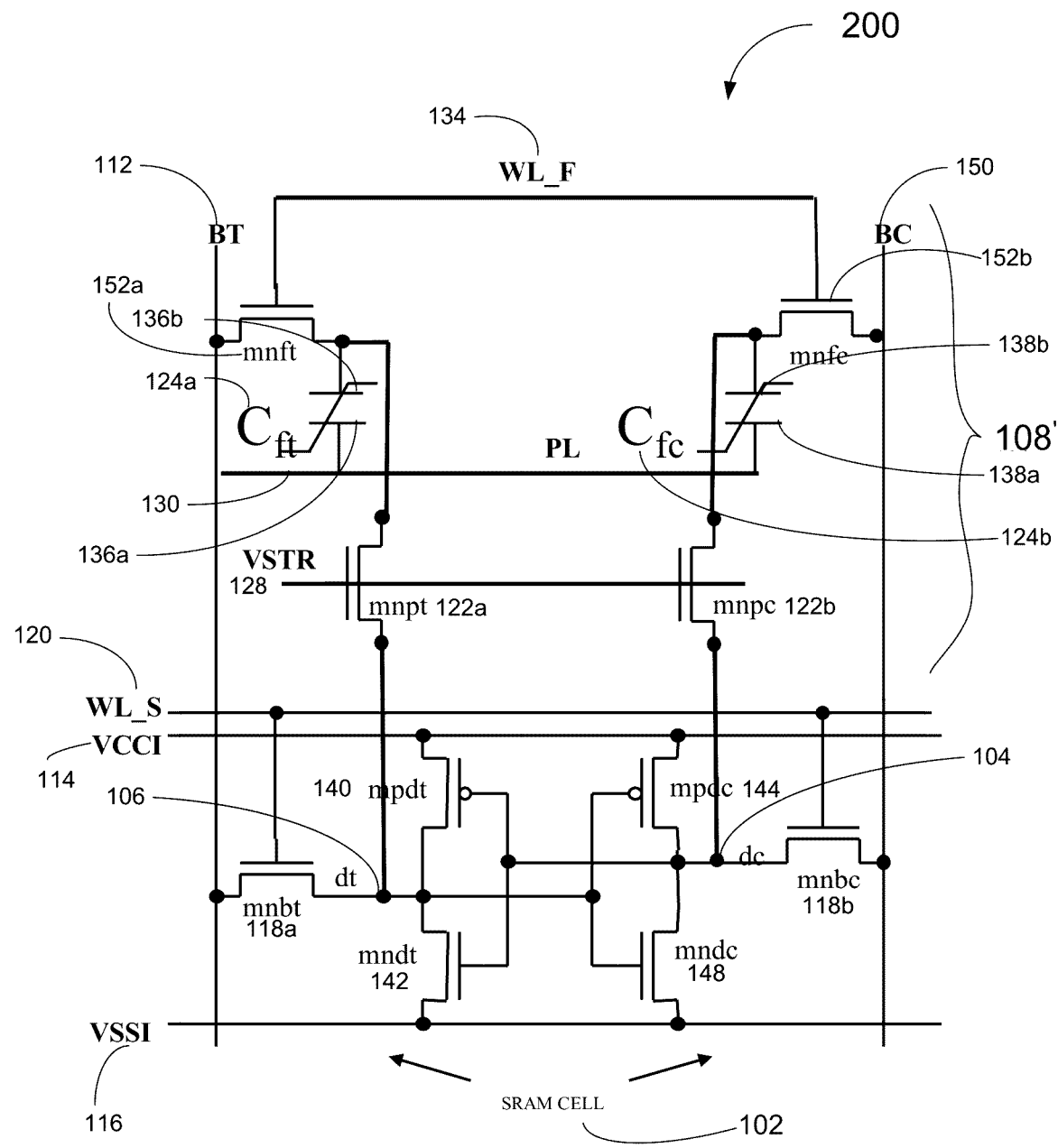
FIG. 1B is a schematic diagram illustrating an nvSRAM memory cell in accordance with another embodiment of the subject matter.

In one embodiment, during SRAM cell 102 read operation, bit-lines BT 112 and BC 150 are both pre-charged with a high voltage. Although, as previously explained, transistors mnft 152*a* and mnfc 152*b* are switched off, there may be current leakage from bit-lines BT 112 and BC 150 to charge upper plates 136*b* & 138*b* of first and second ferroelectric capacitors Cft 124*a* and Cfc 124*b*. Similarly, there may be current leakage from nodes dt 106 and dc 104 via store transistors mnpt 122*a* and mnpc 122*b*. Since polarization line PL130 is held at Vground, the potential current leakage from bit-lines BT 112, BC 150, nodes dt 106 and/or dc 104 may cause first and second ferroelectric capacitors Cft 124*a* and Cfc 124*b* to go from logic state "0" (U Term) to logic state "1" (P Term). In order to ensure both the lower and upper plates 136*a*&*b* and 138*a*&*b* of first and second ferroelectric capacitors Cft 124*a* and Cfc 124*b* are at Vground even with potential current leakage to upper plates 136*b* and 138*b*, in one optional embodiment, upper plates 136*b* & 138*b* are each coupled to the source-drain paths of discharge transistors mdt 132*a* and mdc 132*b* respectively. As illustrated in FIG. 3, discharge transistors mdt 132*a* and mdc 132*b* are both coupled to Vground. In one embodiment, during an SRAM cell 102 read operation, WL_D is asserted to turn on discharge transistors mdt 132*a* and mdc 132*b* such that any potential current leakage to upper plates 136*b* and 138*b* are discharged to ground. In one alternative embodiment, discharge circuit which includes discharge transistors mdt 132*a* and mdc 132*b* is not incorporated, as illustrated in FIG. 1B. Irrespective of presence of the discharge circuit, during an SRAM cell 102 read operation, word-line or signal WL_S 120 is asserted such that transistors mnbt 118*a* and mnbc 118*b* are both turned on and logic value maintained at true and complementary nodes dt 106 and dc 104 are transferred out to bit-lines BT 112 and BC 150, according to description above.

In one embodiment, during a write operation of SRAM cell 102, bit-lines BT 112 and BC 150 are each pre-charged to a desired logic value which is to be written to data latch nodes dt 106 and dc 104. Similar to the SRAM cell 102 read operation, WL_F 134 and VSTR signal 128 are not asserted to turn off transistors mnft 152*a*, mnfc 152*b*, mnpt 122*a* and mnpc 122*b* and PL signal 130 is coupled to Vground. Discharge circuit, if present, will be enabled by asserting WL_D so that potential current leakage from one of the bit-lines BT 112 or BC 150 and SRAM cell 102 will be discharged. In one embodiment, word-line WL_S signal 120 is asserted so that desired logic state values will be transferred from bit-lines BT 112 and BC 150 to latch nodes dt 106 and dc 104, as previously described.

In one embodiment, during a stand-by state of SRAM cell 102 of nvSRAM 100, operation voltages are similar to read and write operations except word-line WL_S 120 is not asserted so that nvSRAM 100 is isolated from bit-lines BT 112 and BC 150.

Referring to FIG. 2, in one embodiment, operation power is monitored such that SRAM cell 102 operates normally, in step 204. If and when operation power is available, SRAM cell 102 executes SRAM Read and Write Operations and nv cell 108 is isolated from SRAM cell 102 and bit-lines BT 112 and BC 150, in step 206. If operation power dips below a threshold level, in one embodiment, data bit maintained at data latch nodes dt 106 and dc 104 is received and stored in nv cell 108, in step 208. When operation power is restored, data bit stored in nv cell 108 will be read out directly to bit-lines BT 112 and BC 150, in step 212. Subsequently, as an optional step, the read-out data bit is written back to SRAM cell 102 from an external element, such as a sense amplifier (not shown), in step 214. Detailed operation configuration of the NV Store Operation, NV Read Operation, SRAM Read and Write Operation and the optional SRAM Recall Operation are discussed herein.

Figure 5:
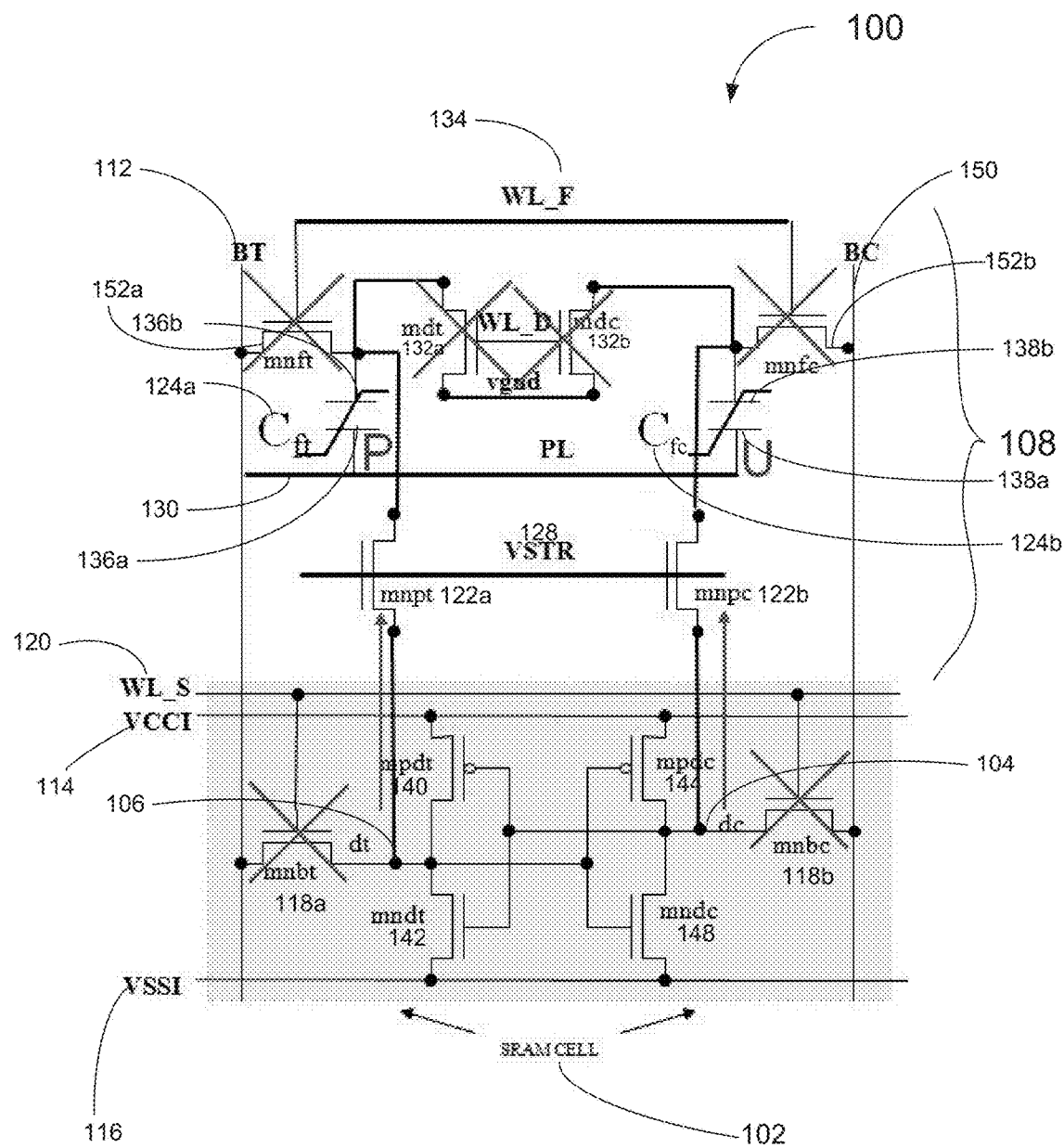
FIG. 5 is a schematic diagram illustrating an nvSRAM memory cell in accordance with one embodiment of the subject matter during a NV store operation.

NV Store Operation:

Referring to step 208 of FIG. 2, in one embodiment, NV store operation of nvSRAM 100 may be automatic that happens whenever a power-down condition is sensed, and/or initiated. Irrespective of the mode of initiation, as illustrated in FIG. 5, word-line WL_F 134 and WL_S 120 are not asserted. As a result, pass transistors mnft 152a, mnfc 152b of nv cell 108 and mnbt 118a and mnbc 118b of SRAM cell 102 are all turned off so that nvSRAM 100 is completely isolated from bit-lines BT 112 and BC 150. In one embodiment, discharge circuit that includes transistors mdt 132a and mdc 132b are also turned off so that upper plate 136b of Cft 124a of nv cell 108 is only connected electrically to true data node dt 106 of SRAM cell 102 whereas upper plate 138b of Cfc 124b to complementary data node dc 104. During the NV store operation, polarization line PL 130 is coupled to Vground such that lower plates 136a and 138a of the ferroelectric capacitors are grounded. In one exemplary embodiment, logic state at true data node dt is "1" or high and complementary data node is "0" or low. In one embodiment, when power is down, logic states at latch nodes dt 106 and dc 104 will eventually dissipate and need to be latched out to nv cell 108 before they disappear. When signal VSTR 128 is slowly brought up high, store transistors mnpt 122a and mnpc 122b are turned on so logic states (maintained voltages) of latch nodes dt 106 and dc 104 are coupled to upper plates 136b and 138b, respectively. Referring to Cft 124a, a high voltage ("1") at upper plate 136b and ground voltage at lower plate 136a turns Cft 124a to a logic "1" (P-term), whereas a 0V voltage on both upper and lower plates 138b and 138a retain a logic "0" (U-term) of Cfc 124b. As a result, logic states of Cft 124a and Cfc 124b match those at latch nodes dt 106 and dc 104 respectively, and remain unchanged even when operation power to nvS-RAM 100 is down, until Cft 124a and Cfc 124b are programmed again. In one embodiment, in an nvSRAM array, an NV store operation of nvSRAM cells 100 of the array (not shown) may happen in bulk mode and the entire nvSRAM array may perform the NV store operation simultaneously. In one embodiment, it takes less power and time to program ferroelectric capacitors. Comparing to other NV memories, such as floating gate transistors which may take up to 8 ms for a store operation, store time of nvSRAM 100 may be less than 1 μs.

Figure 6:
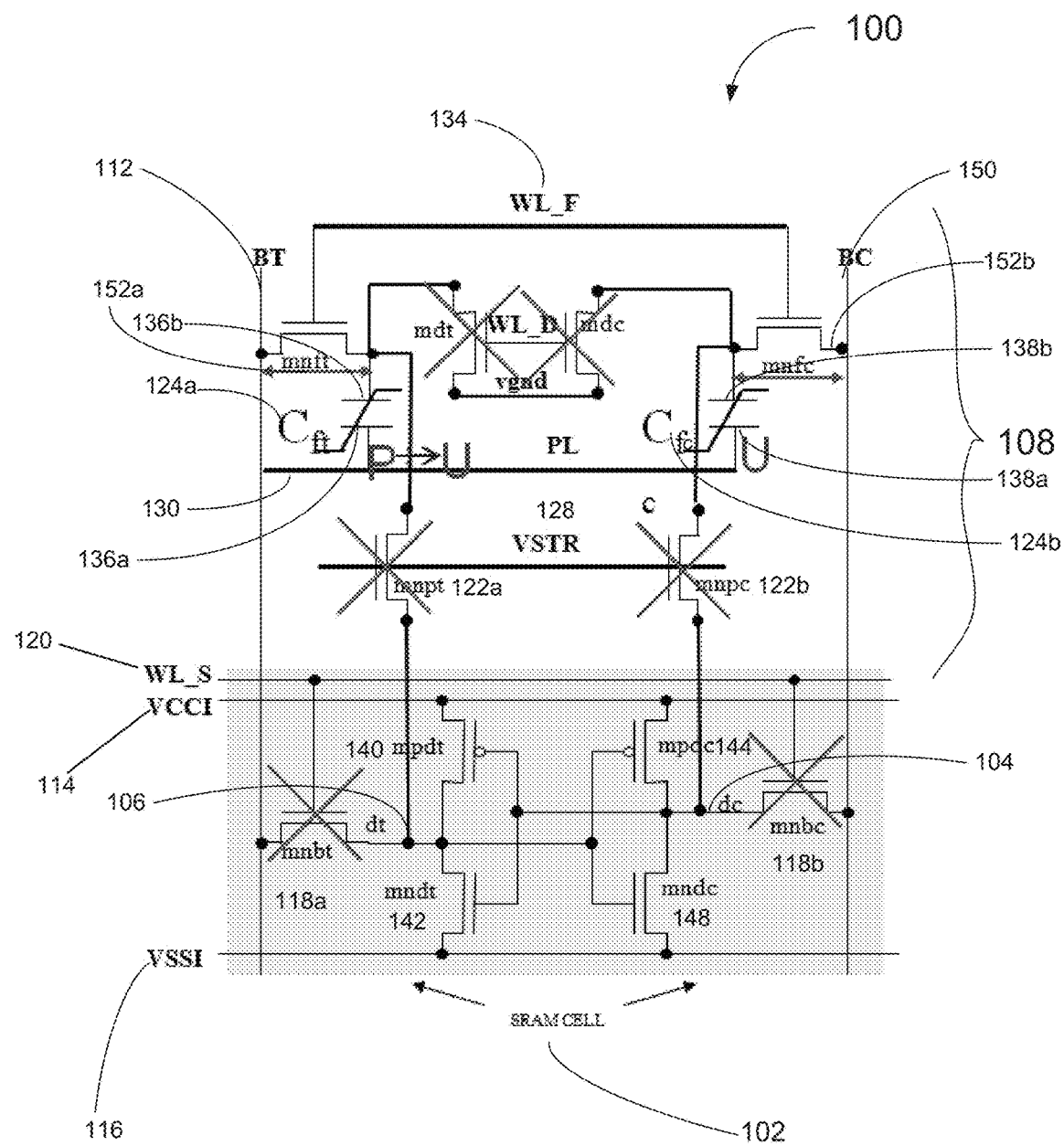
FIG. 6 is a schematic diagram illustrating an nvSRAM memory cell in accordance with one embodiment of the subject matter during a NV read operation.

NV Read Operation:

Referring to step 212 of FIG. 2, in one embodiment as best illustrated in FIG. 6, nvSRAM cell 100 in accordance with one embodiment of the subject matter during an NV read operation. In one embodiment, an NV read operation may happen after power restoration to nvSRAM cell 100 and logic states (a bit of data) stored at nv cell 108 are read out. In one embodiment, in a conventional nvSRAM cell, a recall operation, which logic states previously stored at the NV cell are returned to the SRAM cell, is necessary. The SRAM cell may then transmit the bit of data to the exterior environment via bit-lines, if desired. Referring to FIG. 6, during an NV read operation, contents of ferroelectric capacitors Cft 124a and Cfc 124b are read out to bit-lines BT 112 and BC 150 directly and no recall operation to SRAM cell 102 is required. In one embodiment, an NV read operation of nvSRAM 100 resembles a read operation of a conventional F-RAM. Referring to FIG. 6, to initiate an NV read of nvSRAM 100, word-line WL_S 120 and VSTR 128 are not asserted so SRAM cell 102 is isolated from bit-lines BT 112, BC 150 and nv cell 108. In one embodiment, word-line WL_F 134 is asserted to turn on pass transistors mnft 152a and mnfc 152b such that upper plates 136b & 138b of Cft 124a and Cfc 124b are coupled to bit-lines BT 112 and BC 150, respectively. Word-line WL_D is not asserted to disable discharge circuit (transistors mdt 132a and mdc 132b). In one embodiment, bit-lines BT 112 and BC 150 are pre-charged at Vground so any residual charge at upper plates 136b & 138b of Cft 124a and Cfc 124b is discharged and also at Vground. Subsequently, polarization line PL 130 is asserted and brought high. In one embodiment, with the lower plates 136a & 138a at a high voltage Vhigh and upper plate 136b &138b at Vground, both Cft 124a and Cfc 124b are either programmed to or caused to remain at U-term (logic "0") irrespective of their previous logic states. Referring to the previous exemplary embodiment wherein ferroelectric capacitor Cft 124a holds a logic "1" (P-term), the re-orientation of the atoms (caused by polarization switch from P-term to U-term) in the film in ferroelectric capacitor Cft 124a will cause a brief pulse of current in the output as it pushes electrons onto bit-line BT 112. The pulse is subsequently sensed by an external device, such as a sense amplifier (not shown) to determine "1" logic state of nvSRAM 100. Since there is no change of logic state in Cfc 124b as it remains a logic "0" (U-term), no significant current pulse will be pushed down bit-line BC 150 which indicates a "0" logic. Subsequently, once logic states of ferroelectric capacitors Cft 124a and Cfc 124b are read out, to end the NV read operation, bit-lines BT 112 and BC 150 are pre-charged to Vhigh again and word-line WL_F 134 is brought low to isolate nv cell 108. Word-line WL_D is then asserted again to turn on discharge circuit (transistors mdt 132a and mdc 132b), if present, to dissipate any current leakage to upper plates 136b and 138b of Cft 124a and Cfc 124b. In one embodiment, the NV read operation is destructive as it overwrites both Cft 124a and Cfc 124b to U-term ("0" logic). However, unlike a conventional F-RAM read, no write back operation is necessary as ferroelectric capacitors Cft 124a and Cfc 124b both should remain at U-term ("0" logic) until the next NV store operation. In one embodiment, a similar NV read operation is performed in the event when Cft 124a holds U-term and Cfc 124b holds P-term. One object of leaving ferroelectric capacitors at U term after NV read without write back cycles is to enhance the retention life time of the ferroelectric capacitors.

SRAM Recall Operation:

Referring to step 214 of FIG. 2, in one embodiment, as an optional operation, logic states that were previously stored in ferroelectric capacitors Cft 124a and Cfc 124b before the NV read operation are written back to SRAM cell 102 via external elements, such as an sense amplifier (not shown). The bit of data that was transmitted to the sense amplifier during the NV read operation is written back to SRAM cell 102 at nodes dt 106 and dc 104 in an SRAM write operation as previously explained so that SRAM cell 102 holds the same bit of data before power went down. The SRAM recall of nvSRAM cell 100 is different from a conventional nvS-RAM in two ways. First, SRAM recall operation is optional for NVSRAM cell 100 as the bit of data stored in the NV elements (Cft 124a & Cfc 124b) are already read out directly from nv cell 108 during the NV Read Operation. Second, the recalled bit of data is not transmitted from nv cell 108 to SRAM cell 102 directly or internally within nvSRAM 100 but via an external device, such as a sense amplifier. In one embodiment, this particular configuration of nvSRAM cell 100 helps eliminate one of the most common obstacles in a conventional nvSRAM during an internal data recall. In many cases of conventional nvSRAM, data latch nodes such as latch nodes dt and dc of SRAM cells may not have enough load to interrogate the NV elements, such as SONOS cell, ferroelectric capacitors. In general, if the NV element is ferroelectric capacitors, the Cload at latch nodes v. Cferro should be at least 3 in order for an internal data recall to work properly.

Figure 7A:
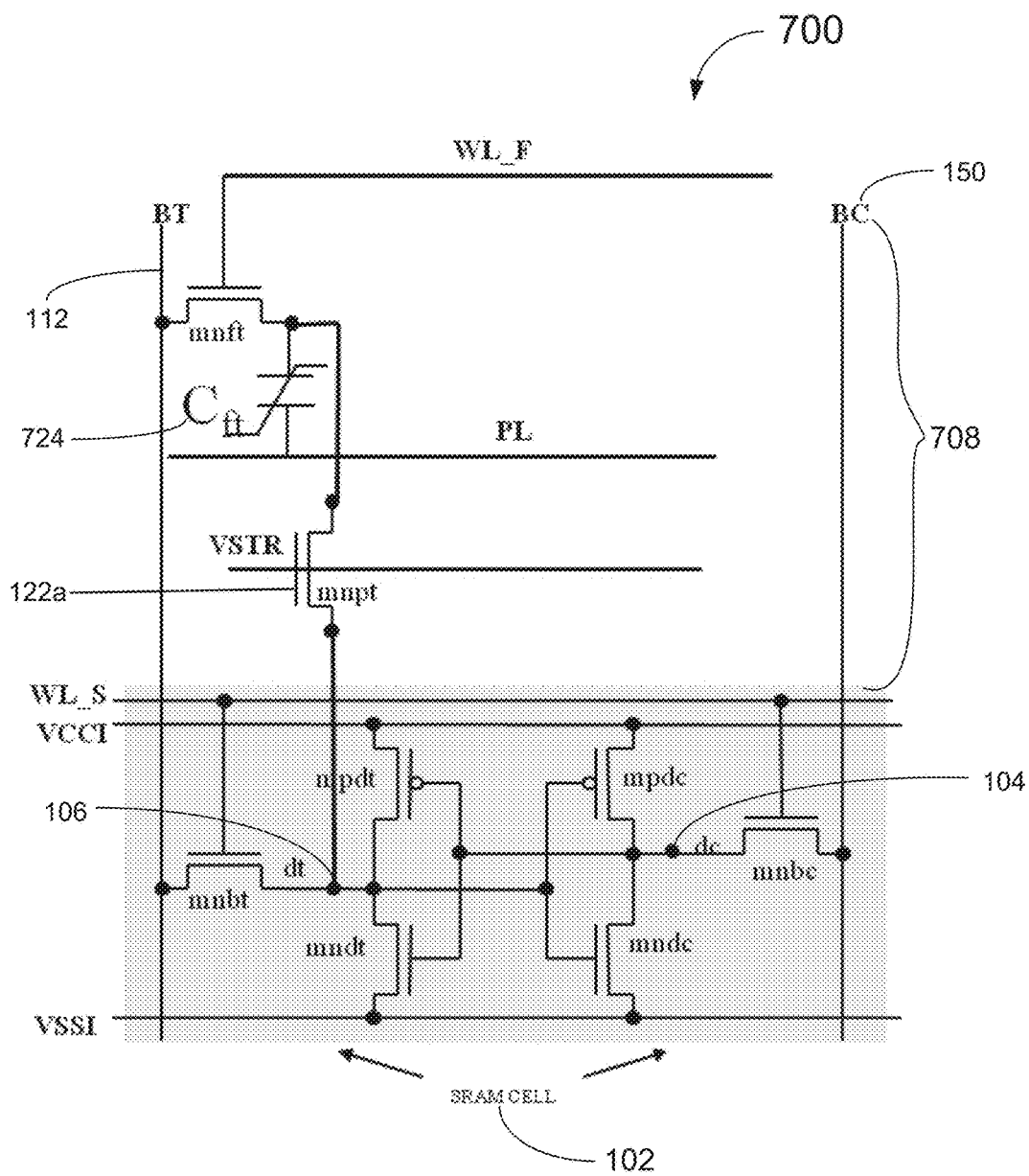
FIGS. 7A and 7B are schematic diagrams illustrating an nvSRAM memory cell in accordance with one transistor one capacitor (1T1C) embodiments of the subject matter.
Figure 7B:
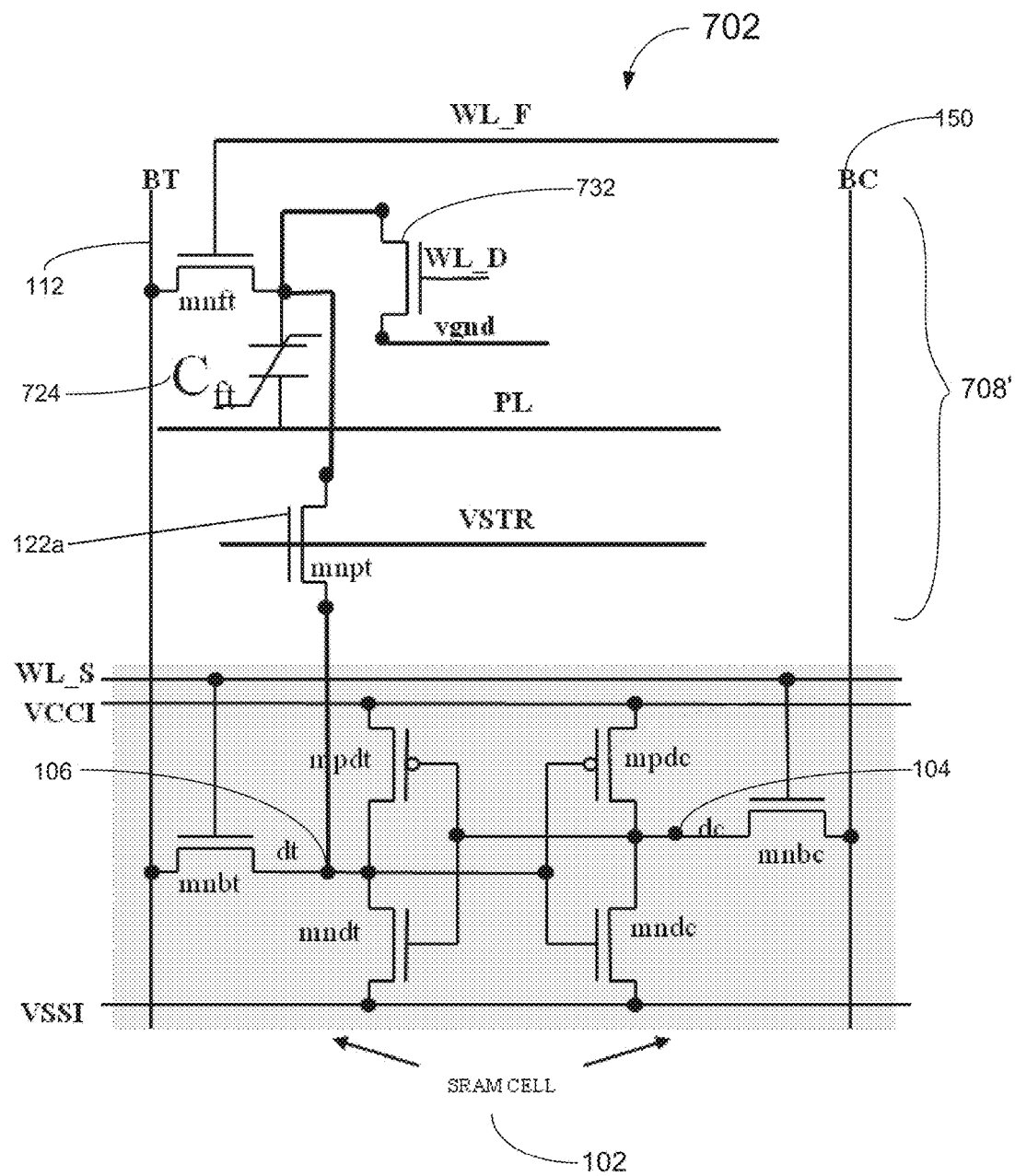

FIGS. 7A and 7B are schematic diagrams illustrating an nvSRAM cell in accordance with one transistor one capacitor (1T1C) embodiments of the subject matter. Referring to FIGS. 7A and 7B, nv cell 708 includes only one ferroelectric capacitor Cft 724 which is coupled to data true node dt 106 of SRAM cell 102 via store transistor mnpt 122a. In one embodiment, nvSRAM cells 700 and 702 are single ended instead of differential like nvSRAM cells 100 and 200. Operation parameters and procedure of SRAM read, write, recall and NV read and store are similar to the embodiments described in FIGS. 1-6. In one embodiment, the bit of complementary data maintained at data complementary node dc 104 is however not stored in nv cell 708 or 708' during power down. As illustrated in FIGS. 7A and 7B, the only difference of the two nv cells 708 or 708' is the presence of the discharge circuit including transistor mdt 732 in nvSRAM 702.

Figure 8:
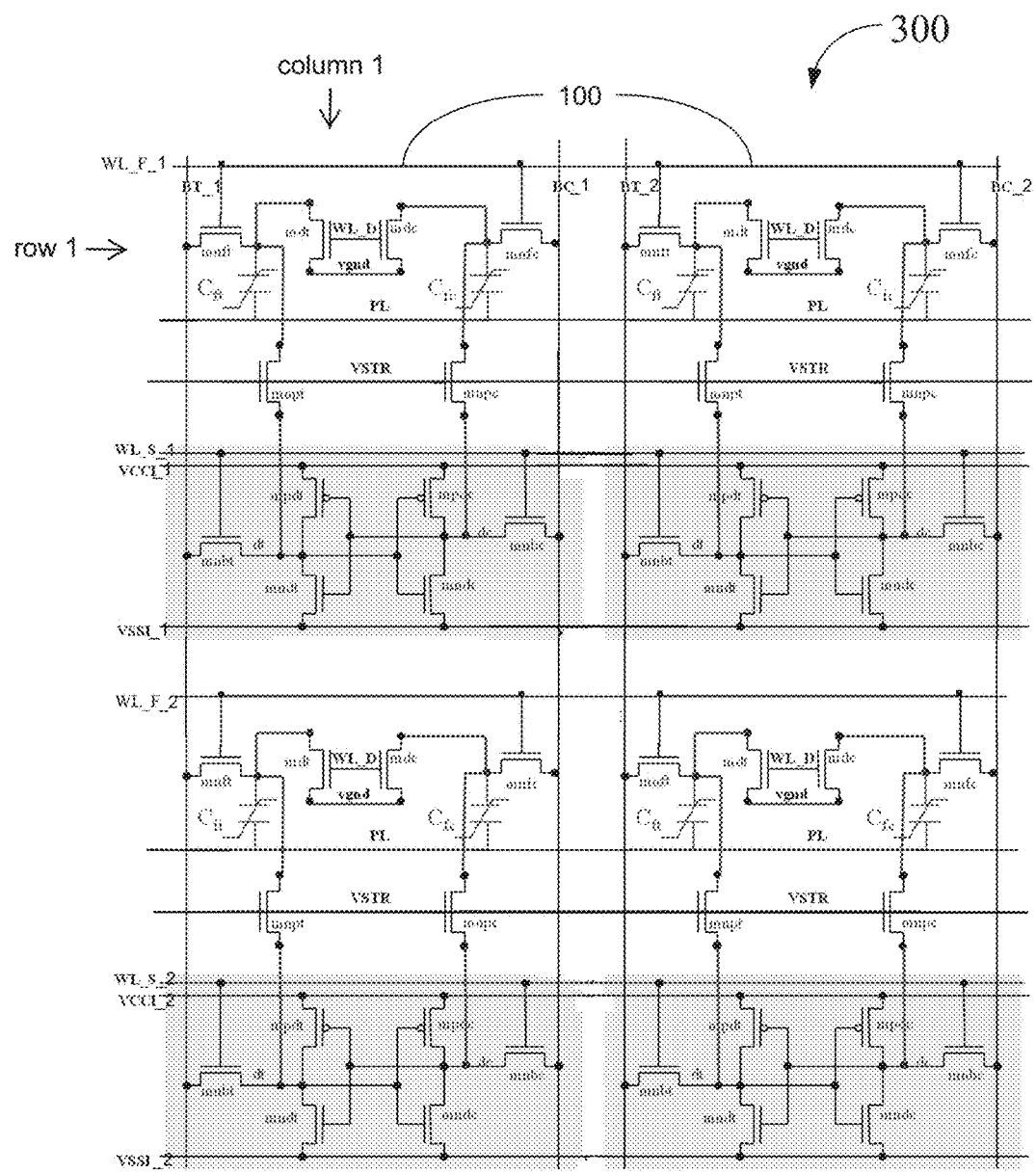
FIG. 8 is a schematic diagram illustrating a portion of an nvSRAM memory array in accordance with a 2T2C embodiment of the subject matter.

FIG. 8 is a schematic diagram illustrating a portion of an nvSRAM array 300 in accordance with a 2T2C embodiment of the subject matter. In one embodiment, as best shown in FIG. 8, nvSRAM array 300 includes nvSRAM cells 100 arranged in rows and columns sharing word-lines, bit-lines and other connections and control signals. In alternative embodiments, nvSRAM array 300 may include combinations of nvSRAM cells 100 as best shown in FIG. 1A, 200 in FIG. 1B, 700 in FIG. 7A and 702 in FIG. 7B arranged in rows and columns, according to system and other operational configurations and preferences. Referring to FIG. 8, nvSRAM cells 100 of the same row share word-line WL_F_y (y denotes row no.) controlling pass transistors mnft and mnfc of each nvSRAM cells 100 of row y. Similarly, nvSRAM cells 100 of the same row may share word-line WL_S_y, VCCI_y and VSSI_y for controlling operations of SRAM cell 102 of each nvSRAM cell 100 on the same row y. In one embodiment, each row of nvSRAM cells 100 may also share a VSTR line which controls operation of store transistors mnpt and mnpc of each nvS-RAM cell 100 on the same row y. As previously explained, when an NV store operation is initiated, in one embodiment, VSTR signal of all VSTR lines is asserted or ramped gradually to a high voltage to turn on store transistors mnpt 122a and mnpc 122b such that the NV store operation may be initiated in the entire nvSRAM array 300 simultaneously. In another embodiment, a singular VSTR line or a number of VSTR lines may be asserted consecutively such that NV store operation is initiated one row or a number of rows at a time. Moreover, nvSRAM cells 100 of a same column may share and be coupled to common bit-lines BT_x and BC_x (x denotes column no.) for data write or read operations.

Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A memory device, comprising:
   a static random access memory (SRAM) circuit including a first data latch node and a second data latch node, the first data latch node configured to be maintained at a first voltage representing one bit of binary data and the second data latch node configured to be maintained at a second voltage representing one bit of complementary binary data;
   a non-volatile (NV) circuit including a first ferroelectric capacitor (F-Cap) coupled to the first data latch node and configured to store the one bit of binary data, wherein the first F-Cap is further coupled to a first bit-line and configured to output the one bit of binary data thereto; and
   a discharge circuit including first and second discharge transistors controllable by a common discharge signal, wherein a source terminal of the first discharge transistor is configured to be coupled to ground and a drain terminal of the first discharge transistor is coupled to the first F-Cap to provide a discharge path for charges accumulated thereat.

2. The memory device of claim 1, wherein the first F-Cap comprises:
   a first plate electrode configured to be coupled to a polarization signal, and a second plate electrode coupled to the first data latch node to receive the first voltage maintained thereat, the second plate electrode is further coupled to the first bit-line and configured to output the one bit of binary data thereto.

3. The memory device of claim 1, wherein the NV circuit further comprises:
a second F-Cap configured to store the one bit of complementary data including,
a third plate electrode configured to be coupled to the polarization signal, and
a fourth plate electrode coupled to the second data latch node to receive the second voltage maintained thereat, the fourth plate electrode is further coupled to a second bit-line and configured to output the one bit of complementary binary data thereto.

4. The memory device of claim 3, wherein:
a source terminal of the second discharge transistor is configured to be coupled to ground and a drain terminal of the second discharge transistor is coupled to the fourth plate electrode of the second F-Cap to provide a discharge path for charges accumulated thereat.

5. The memory device of claim 3, further comprising:
a first store transistor coupled between the first data latch node and the second plate electrode of the first F-Cap; and
a second store transistor coupled between the second data latch node and the fourth plate electrode of the second F-Cap,
wherein the first and the second store transistors are controllable by a common store signal that is configured to control data transmission from the SRAM circuit to the NV circuit.

6. The memory device of claim 1 is configured to inhibit transmission of the one bit of binary data and the one bit of complementary binary data from the NV circuit to the SRAM circuit within the memory device.

7. The memory device of claim 3, further comprising:
a first pass transistor connecting the first bit-line to the second plate electrode of the first F-Cap; and
a second pass transistor connecting the second bit-line to the fourth plate electrode of the second F-Cap,
wherein the first and the second pass transistors are controllable by a common NV word-line signal that is configured to control the output of the one bit of binary data stored at the first F-Cap to the first bit-line and the output of the one bit of complementary binary data stored at the second F-Cap to the second bit-line, respectively.

8. A method of operating a memory device including a non-volatile (NV) circuit and a static random access memory (SRAM), the method comprising:
writing a complementary binary data pair to the SRAM including maintaining a high voltage and a low voltage representing the complementary binary data pair at a first node and a second node of the SRAM, in an SRAM write operation;
coupling the first and the second nodes to a first and a second ferroelectric capacitors of the NV circuit respectively, wherein each of the first and the second ferroelectric capacitors comprises a first and a second plate electrodes;
coupling the first plate electrodes of the first and the second ferroelectric capacitors to a common polarization signal;
coupling the second plate electrodes of the first and second ferroelectric capacitors to drain terminals of first and second discharge transistors of a discharge circuit respectively, wherein source terminals of the first and second discharge transistors are coupled to ground and gates are controlled by a common discharge signal;
polarizing only one of the first or the second ferroelectric capacitors in a first direction by keeping the common polarization signal at a low level and coupling the high voltage maintained at one of the first node and the second node to the second plate electrode of the one of the first and the second ferroelectric capacitors, in an NV store operation;
polarizing the one of the first and the second ferroelectric capacitors in a second direction by asserting the common polarization signal to a high level;
coupling the second plates of the first and the second ferroelectric capacitors to a first and a second bit-lines, respectively; and
reading out the complementary binary data pair stored at the first and the second ferroelectric capacitors to the first bit-line and the second bit-line, respectively, in an NV read operation.

9. The method of claim 8, further comprising:
storing the read-out complementary binary data pair in an external element; and
writing the read-out complementary binary data pair back to the SRAM, in an SRAM recall operation.

10. The method of claim 8, further comprising:
coupling a first store transistor between the first node of the SRAM and the second plate electrode of the first ferroelectric capacitor;
coupling a second store transistor between the second node of the SRAM and the second plate electrode of the second ferroelectric capacitor;
utilizing a common store signal, during the SRAM write operation, the SRAM recall operation and the NV read operation, to isolate the NV circuit from the SRAM circuit; and
utilizing the common store signal, during the NV store operation, to configure the high and the low voltages maintained at the first and the second nodes to couple to the second plates of the first and the second ferroelectric capacitors.

11. The method of claim 10, further comprising:
configuring the common store signal to allow only unidirectional data transmission from the SRAM to the NV circuit within the memory device.

12. A non-volatile (NV) memory array, comprising:
a plurality of NV memory cells arranged in rows and columns, each of the plurality of NV memory cells comprising
a static random access memory (SRAM) circuit including a first data latch node and a second data latch node, wherein the first and the second data latch nodes maintain one bit of binary data and one bit of complementary binary data respectively when operation power is available,
a ferroelectric random access memory (F-RAM) circuit including a first ferroelectric capacitor (F-Cap) configured to receive and store the one bit of binary data from the first data latch node when the operation power dips below the threshold level, and
a discharge circuit including first and second discharge transistors controllable by a common discharge signal, wherein drain terminals of the first and second discharge transistors are configured to be coupled to ground and a source terminal of the first discharge transistor is coupled to the first F-Cap to provide a discharge path for charges accumulated thereat, wherein the common discharge signal controls the F-RAM circuits of a same row;

a plurality of first bit-lines, wherein each of the plurality of first bit-lines is individually coupled to each of the NV circuits of a same column;

a plurality of second bit-lines, wherein each of the plurality of second bit-lines is individually coupled to each of the NV circuits of the same column; and wherein the one bit of binary data stored in each of the NV circuits is configured to be output to its corresponding the first bit-line during an NV read operation.

13. The NV memory array of claim 12, wherein in each of the ferroelectric random access memory (F-RAM) circuits, a first plate electrode of the first F-Cap is configured to be coupled to a polarization signal.

14. The NV memory array of claim 13, wherein each of the F-RAM circuits further includes:

a second ferroelectric capacitor (F-Cap) configured to receive and store the one bit of complementary binary data from the second data latch node when the operation power dips below the threshold level, wherein a first plate electrode of the second F-Cap is configured to be coupled to the polarization signal.

15. The NV memory array of claim 14, wherein:

each of the plurality of first bit-lines is individually coupled to a second plate electrode of the first F-Cap in each of the F-RAM circuits of the same column;

each of the plurality of second bit-lines is individually coupled to a second plate electrode of the second F-Cap in each of the F-RAM circuits of the same column; and the one bit of binary data stored in each of the first F-Cap and the one bit of complementary binary data stored in each of the second F-Cap are output to their corresponding the first and the second bit-lines respectively during the NV read operation.

16. The NV memory array of claim 14, wherein each of the NV memory cells further comprises:

a first store transistor coupled between the first data latch node and the second plate electrode of the first F-Cap; and a second store transistor coupled between the second data latch node and the second plate electrode of the second F-Cap, wherein the first and the second store transistors of the plurality of NV memory cells of a same row are controllable by a row store signal configured to control and allow only unidirectional data transmission from the SRAM circuits to the F-RAM circuits of the NV memory cells of the same row, during an NV store operation.

17. The NV memory array of claim 16, wherein the row store signals are configured to initiate the NV store operation of all of the rows of the plurality of NV memory cells in the NV memory array simultaneously.

18. The NV memory array of claim 16, wherein the row store signals are configured to initiate the NV store operation of at least one row of the plurality of NV memory cells in the NV memory array consecutively.

19. The NV memory array of claim 14, further comprising:

a plurality of NV word-lines, wherein each of the plurality of NV word-lines is coupled individually to a first pass transistor and a second pass transistor of each of the F-RAM circuits of a same row, wherein the first and the second pass transistors connect the first and the second F-Cap in each of the F-RAM circuits of the same row to their corresponding the first bit-line and the second bit-line, respectively.

20. The NV memory array of claim 15, wherein in each of the discharge circuits, the source terminals of the first and the second discharge transistors are coupled to the second plate electrodes of the first F-Cap and the second F-Cap respectively to provide a discharge path for charges accumulated thereat, wherein the common discharge signal controls the F-RAM circuits of the same row.

* * * * *